(12) United States Patent
Kniffler et al.

(10) Patent No.: US 6,543,019 B2
(45) Date of Patent: Apr. 1, 2003

(54) METHOD FOR BUILT-IN SELF TEST OF AN ELECTRONIC CIRCUIT

(75) Inventors: Oliver Kniffler, München (DE); Gerd Dirscherl, München (DE)

(73) Assignee: InfineonTechnologies AG, Munich (DE)

(*) Notice: Subject to any disclaimer, the term of this patent is extended or adjusted under 35 U.S.C. 154(b) by 0 days.

(21) Appl. No.: 09/953,725

(22) Filed: Sep. 17, 2001

(65) Prior Publication Data

US 2002/0046377 A1 Apr. 18, 2002

Related U.S. Application Data

(63) Continuation of application No. PCT/DE00/00775, filed on Mar. 13, 2000.

(30) Foreign Application Priority Data

Mar. 17, 1999 (DE) .......................... 199 11 939

(51) Int. Cl.⁷ .................. G01R 31/28; G06F 11/00; G11C 29/00; G11C 7/00
(52) U.S. Cl. .................. 714/733; 714/718; 714/732; 714/739; 365/201
(58) Field of Search ................. 714/733, 732, 714/739, 718; 365/200, 201

(56) References Cited

U.S. PATENT DOCUMENTS

| | | | | |
|---|---|---|---|---|
| 3,961,251 A | * | 6/1976 | Hurley et al. ............... | 714/718 |
| 4,481,627 A | * | 11/1984 | Beauchesne et al. ........ | 714/718 |
| 5,006,787 A | * | 4/1991 | Katircioglu et al. ....... | 324/73.1 |
| 5,051,997 A | * | 9/1991 | Sakashita et al. ............ | 714/732 |
| 5,159,263 A | * | 10/1992 | Yaguchi ..................... | 324/537 |
| 5,173,906 A | | 12/1992 | Dreibelbis et al. | |
| 5,325,367 A | * | 6/1994 | Dekker et al. .............. | 714/718 |
| 5,371,748 A | * | 12/1994 | Saw et al. .................. | 714/740 |
| 5,416,784 A | * | 5/1995 | Johnson ...................... | 714/733 |
| 5,519,713 A | * | 5/1996 | Baeg et al. ................. | 714/724 |
| 5,610,927 A | * | 3/1997 | Segars ........................ | 714/730 |
| 5,638,382 A | * | 6/1997 | Krick et al. ................ | 714/733 |
| 5,689,466 A | | 11/1997 | Qureshi | |
| 5,825,785 A | * | 10/1998 | Barry et al. ................ | 714/732 |
| 5,905,737 A | * | 5/1999 | Osawa et al. ............... | 714/726 |
| 5,954,830 A | * | 9/1999 | Ternullo, Jr. ................ | 714/718 |
| 5,982,189 A | * | 11/1999 | Motika et al. .............. | 324/763 |
| 5,996,097 A | * | 11/1999 | Evans et al. ................ | 714/719 |
| 6,055,655 A | * | 4/2000 | Momohara ................... | 714/723 |
| 6,178,534 B1 | * | 1/2001 | Day et al. ................... | 714/745 |
| 6,185,709 B1 | * | 2/2001 | Dreibelbis et al. .......... | 714/726 |
| 6,311,300 B1 | * | 10/2001 | Omura et al. ............... | 714/724 |
| 6,457,141 B1 | * | 9/2002 | Kim et al. ................... | 714/30 |

FOREIGN PATENT DOCUMENTS

EP  0 340 895 A2  11/1989

* cited by examiner

Primary Examiner—Albert Decady
Assistant Examiner—Joseph D. Torres
(74) Attorney, Agent, or Firm—Laurence A. Greenberg; Werner H. Stemer; Gregory L. Mayback

(57) ABSTRACT

The built-in self test method enables common and concurrent self testing of the combinatorial logic and the memory of an electronic circuit. The common self test circuit for the logic and the memory performs the self test simultaneously for the logic and for the memory.

7 Claims, 2 Drawing Sheets

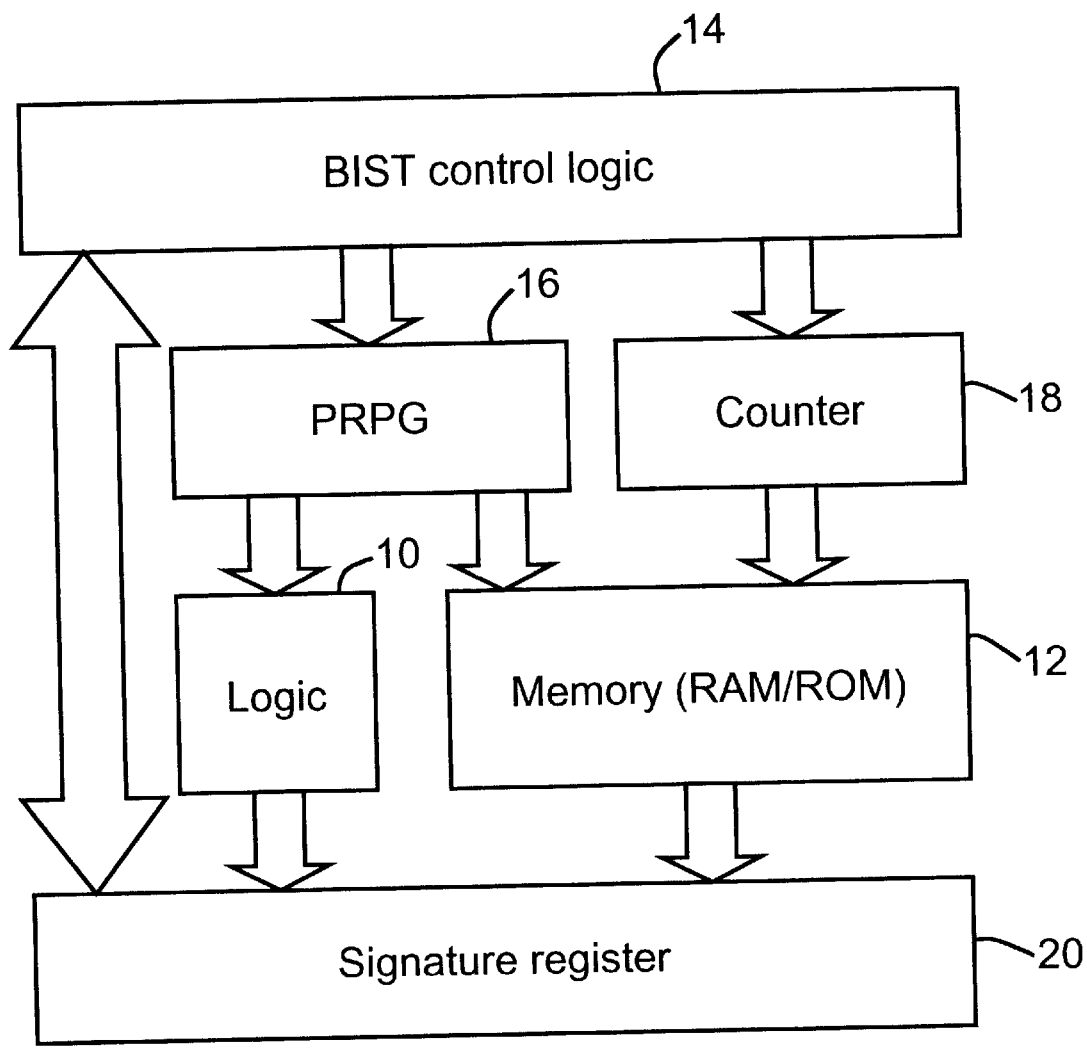

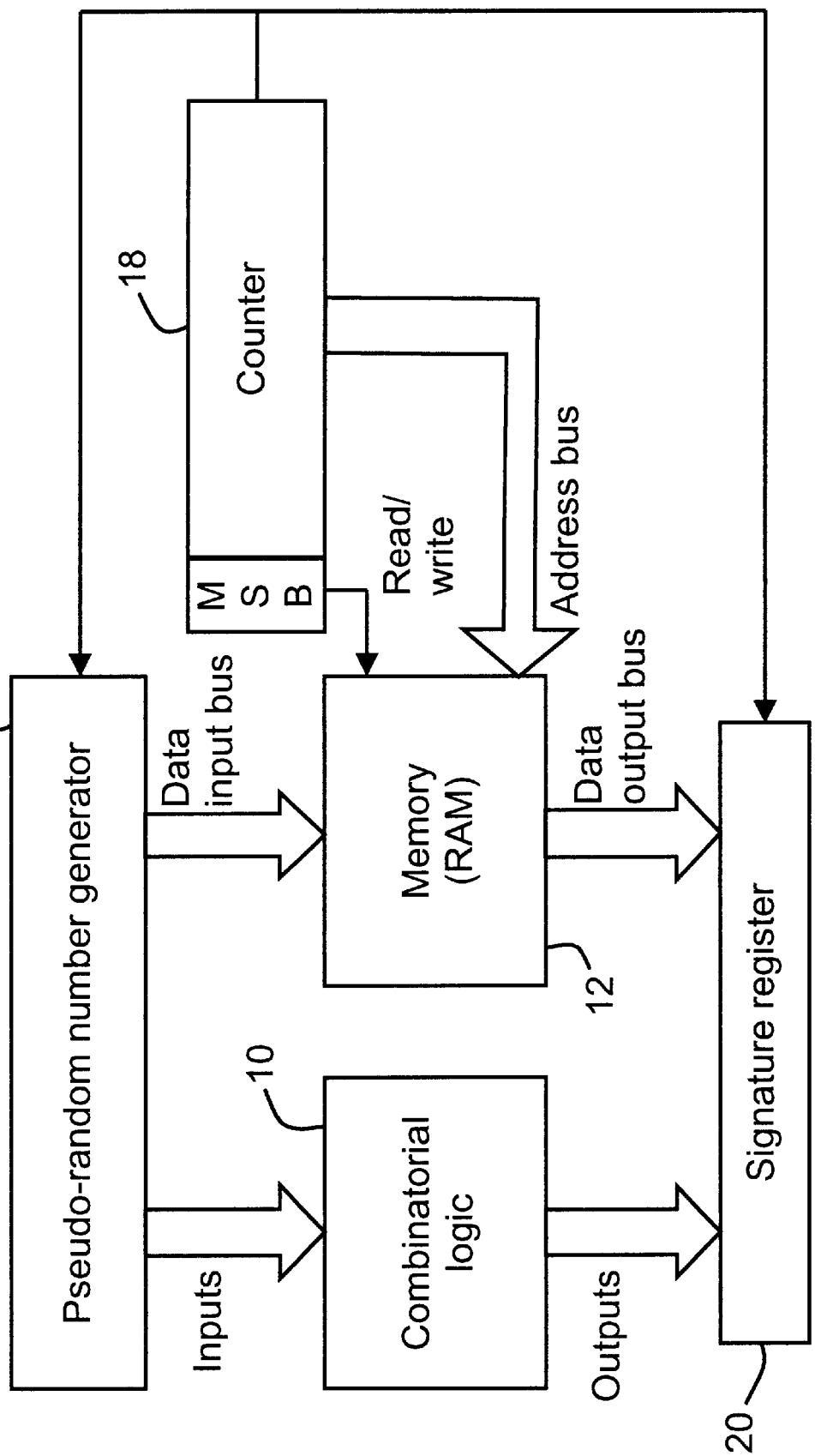

METHOD FOR BUILT-IN SELF TEST OF AN ELECTRONIC CIRCUIT

CROSS-REFERENCE TO RELATED APPLICATION

This application is a continuation of copending International Application No. PCT/DE00/00775, filed Mar. 13, 2000, which designated the United States.

BACKGROUND OF THE INVENTION

Field of the Invention

The present invention relates to a method and a corresponding device for the built-in self test of an electronic circuit which contains both a combinatorial logic and a memory.

Hitherto, the hardware expenditure for the test logic of a built-in self test (BIST) has been extremely large in electronic circuits which contain both a combinatorial logic and memory elements (RAM and/or ROM). This is due to the fact that the combinatorial logic and the memories contained in the same circuit were always tested separately from one another in the prior art. Both a self test circuit for testing the logic and a separate self test circuit which tested only the memory part have therefore been provided according to the prior art. Of course, this involved a considerably higher degree of expenditure on circuitry, and usually also a longer testing time.

SUMMARY OF THE INVENTION

It is accordingly an object of the invention to provide a method and a device for built-in self testing of electronic circuits which contain both a combinatorial logic and a memory, which overcomes the above-mentioned disadvantages of the heretofore-known devices and methods of this general type and which renders it possible to implement this device and this method with considerably less expenditure on hardware, and preferably also to reduce the time required for the self test.

With the foregoing and other objects in view there is provided, in accordance with the invention, a method for the built-in self test of an electronic circuit which contains a combinatorial logic and a memory. The method comprises the following steps:

providing a common self test circuit for the logic and the memory of the electronic circuit, the self test circuit having a pseudo-random pattern generator and a signature register connected to the logic and to the memory, and wherein the memory is addressed with a counter;

stimulating the logic with patterns from the pseudo-random pattern generator to simultaneously test the logic and the memory; and concurrently writing the patterns of the pseudo-random pattern generator to the memory.

In accordance with a further feature of the invention, the self test is controlled with a clock pulse clocking both the counter for addressing the memory and the pseudo-random number generator supplying the input data for the combinatorial logic and for the memory.

The objects of the invention are thus achieved with the common self test circuit that simultaneously tests the logic and the memory.

In this context it is particularly preferred for the self test circuit to comprise a pseudo-random pattern generator which is connected both to the logic and to the memory. In this way, only a single pseudo-random pattern generator is required. It is also advantageous if the control logic for the self test is connected both to the pseudo-random pattern generator and to the counter for addressing the memory.

The outputs of the logic and of the memory are preferably connected to a common signature register. In this way, one signature register is sufficient.

It is particularly preferred here for both the signature register and the pseudo-random pattern generator to be constructed from feed-back shift registers.

Furthermore, the present invention achieves this object by means of a method for the built-in self test of such a circuit, wherein method the logic and the memory are tested simultaneously and largely using the same hardware.

It is particularly preferred here for the self test to be controlled by means of a clock pulse which clocks both a counter for addressing the memory and a pseudo-random pattern generator which supplies the input data both for the combinatorial logic and for the memory.

The output data of the combinatorial logic and of the memory are preferably fed to the signature register wherein this data are compressed. In this way, a single signature register is sufficient for the common self test.

A sequence of the self test which is particularly easy to follow is obtained if the counter determines the address of the memory to which the data of the pseudo-random generator are written.

In accordance with a preferred feature of the invention, the most significant bit of the counter determines whether the memory is written to or the memory is read so that, as the counter increments or decrements, all the memory addresses are first written to and then read. Therefore, if the counter increments, the writing state must correspond to the most significant bit at 0, and the reading state to the most significant bit at 1. If the counter counts backwards (decrements), the most significant bit 1 means writing and the most significant bit 0 means reading.

In accordance with another feature of the invention, the end of the self test is determined when the counter overflows.

Fed-back shift registers are preferably used respectively as the signature register and as the pseudo-random generator.

Other features which are considered as characteristic for the invention are set forth in the appended claims.

Although the invention is illustrated and described herein as embodied in a method and a device for the built-in self test of an electronic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a self test circuit according to the invention; and FIG. 2 is a more detailed block diagram of the self test circuit according to the invention in FIG. 1.

DESCRIPTION OF THE PREFERRED EMBODIMENTS

Referring now to the figures of the drawing in detail and first, particularly, to FIG. 1 thereof, the present invention serves as a testing circuit for the built-in self test (BIST) of an electronic circuit which contains both a combinatorial logic 10 and a memory (RAM and/or ROM) 12. The entire sequence of the built-in self test is controlled by the BIST control logic 14. For this purpose, the control logic 14 has access possibilities to the data of the further circuit components which are used to carry out the self test. Those circuit components include a pseudo-random pattern generator (PRPG) 16, a counter 18, and a signature register 20.

With particular reference to FIG. 2, the outputs of the pseudo-random number generator 16 are connected to the inputs of the combinatorial logic 10 and to the data inputs of the memory 12. The outputs of the combinatorial logic 10 and the data output of the memory 12 are connected to the signature register 20. The counter 18 is connected by its most significant bit (MSB) to the read/write control input of the memory 12, while all the other bits of the counter 18 are connected to the address inputs of the memory 12.

The sequence of such a self test, for example in the case of a circuit which serves as an instruction cache of a CPU (Central Processor Unit), is as follows:

The sequence of the self test is supervised by the control logic 14. At the start, the module to be tested, which is composed of the logic 10 and memory 12, and the counter 18 for addressing the memory 12, the pseudo-random pattern generator (PRPG) 16 and the signature register 20 are reset. During the test, the counter is clocked, and increments or decrements. The counter reading is used here to select all the memory locations of the memory 12, and also to change between writing and reading in the case of a read/write memory (RAM). For example, the most significant bit (MSB) or the least significant bit (LSB) of the counter 18 is used for this purpose. In parallel with this, the combinatorial logic 10 is stimulated, as is usually also the case in the prior art, with the pseudo-random patterns from the pseudo-random number generator 16. However, according to the invention, the same output data of the pseudo-random number generator 16 is used simultaneously to write to the memory 12.

The outputs of the combinatorial logic 10 and of the memory 12 are connected to the signature register 20 wherein the corresponding output data are compressed and stored. After the self test has run, the duration of which is controlled by the control logic and or by the counter 18, for example by detecting the overflowing of the counter 18 or by detecting a specific counter reading by means of a comparator, the contents of the signature register are compared with a reference value.

Fed-back shift registers, for example shift registers which are fed back in a linear or nonlinear fashion or cellular automators are preferably used as the pseudo-random number generator and as the signature register. Any desired memories can be used as the memory if the memories are read only memory (ROM), the reading of the counter 18 is used for successively addressing for a read access.

In this case, the following procedure is preferably selected:

When the self test starts, all the components are reset again. The rest of the test sequence is controlled essentially by the counter 18. When the counter starts, the signature register 20 is reset and the pseudo-random number generator 16 is loaded with a start value by the control logic 14. Whenever the counter continues counting, the random number generator 16 generates a test pattern which feeds the inputs of the combinatorial logic 10. At the same time, the pattern is written into the memory 12. The counter reading determines here the address in the memory 12. The most significant bit (MSB) of counter 18 is used to distinguish between writing and reading (the memory must firstly have the patterns written to it, and the entire memory must then be read).

Here, the counter can either be incremented by the counter reading 0, and the most significant bit 0 then corresponds to the writing state, and the most significant bit 1 to the reading state. Conversely, the counter can, of course, also be decremented by starting from the counter reading 1111 . . . Then, all that is necessary is to interchange the assignment of the most significant bit to reading and writing. At the same time, the outputs of the combinatorial logic 10 and the data output bus (during reading) of the memory 12 are transmitted into the signature register 20 and compressed there.

If the counter 18 has run out (for example in the case of a counter overflow or when counting backward at counter 0) or when a previously defined counter reading is reached, the self test is terminated. The contents of the shift register can then be read and compared with a reference value which may be determined by simulation, for example.

According to the invention, the combinatorial logic and the memories embedded therein are therefore no longer tested separately from one another, that is to say by means of different test hardware and where possible also in chronological succession, but rather simultaneously and largely using the same test hardware. As a result, it is possible to avoid a considerable doubled expenditure on circuitry (for example signature register, test time counter, control logic), and the self test of the two components necessarily takes place at the same time. As a result, the invention also leads to a considerable savings in testing time.

We claim:

1. A method for the built-in self test of an electronic circuit containing a combinatorial logic and a memory, which comprises:

providing a common self test circuit for the logic and the memory of the electronic circuit, the self test circuit having a pseudo-random pattern generator and a signature register connected to the logic and to the memory, and wherein the memory is addressed with a counter;

stimulating the logic with patterns from the pseudo-random pattern generator to simultaneously test the logic and the memory; and concurrently writing the patterns of the pseudo-random pattern generator to the memory.

2. The method according to claim 1, which comprises controlling the self test with a clock pulse clocking both the counter for addressing the memory and the pseudo-random number generator supplying the input data for the combinatorial logic and for the memory.

3. The method according to claim 1, which comprises feeding the output data of the combinatorial logic and of the memory to the signature register, wherein the data are compressed.

4. The method according to claim 1, which comprises determining with the counter an address of the memory to which the data of the pseudo-random generator are written.

5. The method according to claim 4, which comprises determining with a most significant bit generated by the counter whether the memory is written to or the memory is read from, so that, as the counter increments or decrements, all the memory addresses are first written to and then read.

6. The method according to claim 4, which comprises defining an end of the self test when the counter overflows.

7. The method according to claim 1, which comprises providing feed-back shift registers respectively as the signature register and as the pseudo-random generator.

* * * * *